(12) United States Patent
Fuergut et al.

(10) Patent No.: US 9,496,228 B2
(45) Date of Patent: Nov. 15, 2016

(54) INTEGRATED CIRCUIT AND METHOD OF MANUFACTURING AN INTEGRATED CIRCUIT

(71) Applicant: Infineon Technologies AG, Neubiberg (DE)

(72) Inventors: Edward Fuergut, Dasing (DE); Joachim Mahler, Regensburg (DE); Ivan Nikitin, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/987,820

(22) Filed: Jan. 5, 2016

(65) Prior Publication Data

US 2016/0211226 A1    Jul. 21, 2016

(30) Foreign Application Priority Data

Jan. 21, 2015   (DE) .................. 10 2015 100 868

(51) Int. Cl.
*H01L 23/00* (2006.01)
*H01L 23/495* (2006.01)
*H01L 23/31* (2006.01)
*H01L 21/48* (2006.01)
*H01L 21/56* (2006.01)
*H01L 21/78* (2006.01)

(52) U.S. Cl.
CPC ......... *H01L 23/562* (2013.01); *H01L 21/4825* (2013.01); *H01L 21/565* (2013.01); *H01L 21/78* (2013.01); *H01L 23/3114* (2013.01); *H01L 23/49513* (2013.01); *H01L 23/49582* (2013.01); *H01L 23/49586* (2013.01)

(58) Field of Classification Search
CPC .......... H01L 2924/15165; H01L 2924/15153; H01L 224/45099; H01L 23/53292; H01L 24/01

USPC .............. 257/701, 703, 746, 782, 783, 787; 438/118, 119, 125, 127
See application file for complete search history.

(56) References Cited

U.S. PATENT DOCUMENTS

| | | | | |
|---|---|---|---|---|
| 5,838,063 A * | 11/1998 | Sylvester | ................ | H01L 23/10 257/678 |
| 6,104,090 A * | 8/2000 | Unger | ................. | H01L 23/3733 257/677 |
| 7,906,843 B2 * | 3/2011 | Palanduz | ............ | H01L 21/4857 175/255 |
| 8,525,341 B2 * | 9/2013 | Kim | ..................... | H05K 3/4602 174/250 |
| 9,165,792 B2 | 10/2015 | Hosseini et al. | | |

(Continued)

FOREIGN PATENT DOCUMENTS

| | | |
|---|---|---|
| DE | 102004054063 B3 | 6/2006 |
| DE | 102007036841 A1 | 2/2009 |

(Continued)

OTHER PUBLICATIONS

Products-Webpage "Hoffmann Elektrokohle" for Aluminium Graphite (http://www.hoffmann.at/en/hos/Thermal-Management/schunk01.c.44935.en).

*Primary Examiner* — Sheila V Clark (57) ABSTRACT

In various embodiments, an integrated circuit is provided. The integrated circuit may include a semiconductor chip and an electrically conductive composite material fixed to the semiconductor chip, wherein the electrically conductive composite material may include a metal, and wherein a coefficient of thermal expansion (CTE) value of the electrically conductive composite material may be lower than the CTE value of the metal.

29 Claims, 6 Drawing Sheets (56) References Cited

U.S. PATENT DOCUMENTS

2012/0175755 A1 7/2012 Bayerer
2014/0084302 A1 3/2014 Hosseini et al.

FOREIGN PATENT DOCUMENTS

DE 102012200329 A1 7/2012
DE 102013110541 A1 3/2014

* cited by examiner

INTEGRATED CIRCUIT AND METHOD OF MANUFACTURING AN INTEGRATED CIRCUIT

CROSS-REFERENCE TO RELATED APPLICATION

This application claims priority to German Patent Application Serial No. 10 2015 100 868.8, which was filed Jan. 21, 2015, and is incorporated herein by reference in its entirety.

TECHNICAL FIELD

Various embodiments relate generally to an integrated circuit and to a method of manufacturing an integrated circuit.

BACKGROUND

In conventional housing technology of chips, e.g. semiconductor chips, a chip may be bonded to a carrier, e.g. a leadframe. Requirements regarding a thermal and/or an electrical conductivity of the leadframe may lead to copper (Cu) as a material of choice for the leadframe. The thermal and electrical conductivity of copper may be comparatively high.

Typically, the bonding of the chip, e.g. the semiconductor chip, to the leadframe may be formed at an elevated temperature, for example a temperature of more than 200° C. Since coefficients of thermal expansion (CTE) of the bonding partners, i.e. of the chip and the carrier, e.g. the leadframe, may be different, a cooling of the bonded system (of the chip bonded to the leadframe) may lead to a relatively high stress.

The stress may lead to a change in electrical properties of semiconductors, e.g. of the semiconductor material of the chip, and/or to a mechanical failure, for example during a stress test.

A similar kind of stress may be caused by contacting the chip with clips, or by plating, e.g. electroplating, metal contacts on the chip, even though an amount of stress may be lower.

Also in a case where a low-temperature bonding method may be used, e.g. a bonding at room temperature, thermal stress may be caused during an operation of the chip, because operation temperatures, e.g. of power chips, may reach temperatures as high as about 260° C.

In other words, when a device including a semiconductor, e.g. a chip, having a material, e.g. a metal, with a CTE significantly different from the CTE of the semiconductor formed on it, is subjected to large temperature changes, stress may be induced in the semiconductor and/or a connection between the semiconductor and the material (e.g. the metal), irrespective of whether the temperature change may be caused by a cooling after a high-temperature bonding of the material to the semiconductor, a heating of the device during operation, a heating/cooling of the semiconductor device due to ambient temperatures at its place of operation, or any other temperature change.

Until today, a solution for lowering the severe, temperature-induced mechanical degradation of devices and/or of stress between the semiconductor, e.g. silicon, and a metal, e.g. copper, wherein at the same time avoiding a significant influence on (e.g. degradation of) the thermal and/or electrical conductivity of the system, has not been found.

SUMMARY

In various embodiments, an integrated circuit is provided. The integrated circuit may include a semiconductor chip and an electrically conductive composite material fixed to the semiconductor chip. The electrically conductive composite material may include a metal, and a coefficient of thermal expansion (CTE) value of the electrically conductive composite material may be lower than the CTE value of the metal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Unless specified differently, the terms "metal", "metallic", "metal component", "metallic component" and the like herein may include either of a pure metal and a metal alloy.

The term "composite material" herein may be understood as referring to a material including at least two different materials, one of which (e.g. as small particles) being dispersed in the other. It may be understood to not include macroscopic parts being bonded together to form a composite, e.g. a layered laminate.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, the problem may be solved by using, e.g. as a carrier or connection element for the chip, e.g. the semiconductor chip, a highly conductive composite material, which may include a metal, and which may have a coefficient of thermal expansion (CTE) that may have been adjusted to or towards, e.g. matched to, the CTE of the chip, e.g. of a semiconductor material of the chip. The CTE of the conductive composite material may be lower than the CTE of the metal.

In various embodiments, an electrically conductive metal based composite material, e.g. with an electrical conductivity of more than about $35\times10^6$ S/m, with a low CTE, e.g. with a CTE of $12\times10^{-6}$/K (the unit may also be expressed as ppm/K) or lower, e.g. below $10\times10^{-6}$/K, and with a high thermal conductivity (e.g. above 100 W/m K, e.g. above 150 W/m K) may be used as a chip carrier, e.g. a leadframe, and/or as a connection element in a housing, e.g. a chip housing.

In various embodiments, a stress on the semiconductor material may be lower. A bending or arching of the semiconductor material, e.g. the silicon, e.g. of a substrate, and/or of the carrier, e.g. the leadframe and/or of the connection element, e.g. a chip front side interconnect, may be lower, e.g. minimal.

In various embodiments, a bending/arching of the chip, e.g. the semiconductor chip, may be minimized or a stress condition in the semiconductor material, e.g. the silicon, may be adjusted, respectively, by metallizing the chip from two opposite sides, e.g. from a front side and from a back side, with the composite material, e.g. the electrically conductive composite material.

In various embodiments, reducing the stress caused by temperature changes, in other words an increased resistance to thermal cycling, may increase a durability and thereby a lifetime of the device including the semiconductor material, e.g. the chip, and the composite material.

In various embodiments, an increased tolerance towards temperature changes that may be caused by a closer matching of the CTE of the semiconductor and the CTE of the electrically conductive material may make it possible to increase an electrical current that may be channeled through the device. In other words, a performance of the device may be improved.

In various embodiments, a cooling of the device including the chip and the composite material, e.g. the electrically conductive composite material, may be improved, for example as compared with aluminum or a conventional molding compound, e.g. if the composite material may at least partially replace the aluminum or the molding compound.

In various embodiments, properties of the composite material, e.g. the electrically conductive composite material, e.g. mechanical and/or thermal and/or electrical properties, may be finely, easily and/or specifically adjustable by specifically choosing a type of components included in the (e.g. electrically conductive) composite material and their relative amount, e.g. an amount by volume.

In various embodiments, the (e.g. electrically conductive) composite material may at least partially, e.g. at least a portion of the composite material and/or some of the various composite materials, e.g. the various electrically conductive composite materials, be produced using an encapsulation process like injection molding, transfer molding and/or compression molding. The injection molding may lead to lower manufacturing costs.

In various embodiments, the (e.g. electrically conductive) composite material may include at least a metal (e.g. pure or a metal alloy) and a second component, e.g. a ceramic material, carbon (e.g. a carbon allotrope, e.g. graphite) or a second metal. The second component, e.g. the ceramic material, the carbon and/or the second metal) may have a lower CTE than the metal. The metal may have a higher electrical and/or thermal conductivity than the second component, e.g. the ceramic material, the carbon and/or the second metal.

In various embodiments, the electrically conductive composite material may include aluminum and graphite. The electrically conductive composite material may for example be the aluminum graphite composite as produced by "Hoffmann Elektrokohle", which may have a thermal conductivity of above 220 W/mK and a CTE of about $8\times10^{-6}$/K.

In various embodiments, the electrically conductive composite material may include a metal and diamond.

In various embodiments, the electrically conductive composite material may include copper and a ceramic material.

In various embodiments, the electrically conductive composite material may include a metal and molybdenum.

Figure 1:
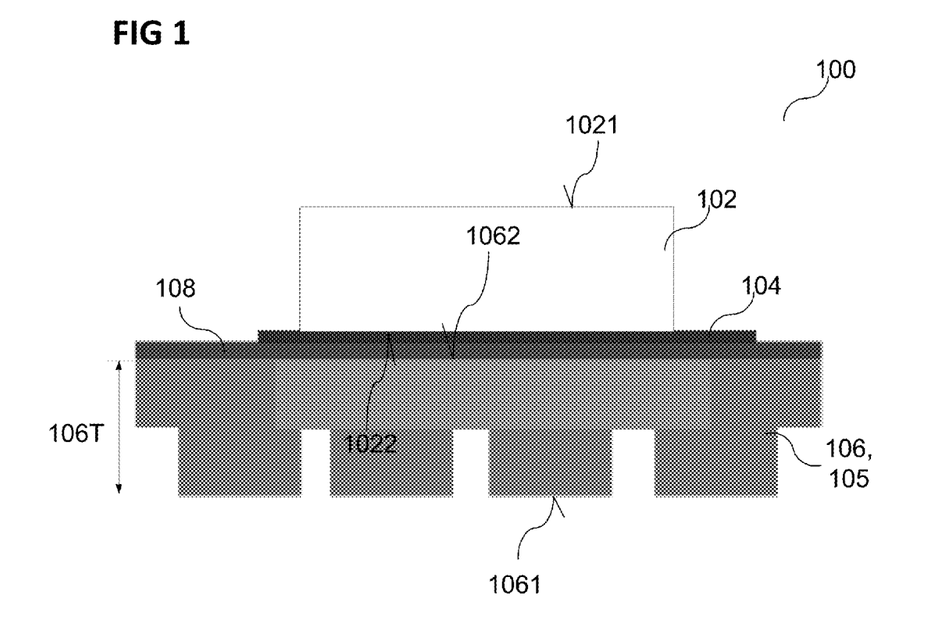
FIG. 1 shows a portion of an integrated circuit in accordance with various embodiments.

FIG. 1 shows an integrated circuit 100 in accordance with various embodiments.

In various embodiments, the integrated circuit 100 may include a semiconductor chip 102, in the following also simply referred to as chip 102, having a first surface 1021 on a first side of the chip 102, and a second surface 1022 on a second side opposite the first side of the chip 102. The semiconductor chip 102 may be or include any known type of semiconductor chip 102, for example a logic chip, a power chip, etc. The semiconductor chip 102 may include or essentially consist of a semiconductor material, e.g. silicon, germanium, semiconductor compounds, e.g. III-V-semiconductors, such as gallium arsenide or gallium nitride, II-VI-semiconductors, IV-IV-semiconductors like silicon germanium or silicon carbide, and the like.

In various embodiments, the first side of the chip 102, also referred to as front side or top side of the chip, may be considered as forming an active side of the chip 102. In other words, on the first side, e.g. in and/or on the first surface of the chip 102, at least one electronic component may be formed. The second side may also be referred to as back side of the chip 102.

In various embodiments, on and/or in the second surface 1022 of the chip 102, an electrically conductive connection, e.g. to the at least one electronic component, may be provided. Alternatively, no electrically conductive connection may be provided by the second surface 1022 of the chip 102. A thermally conductive connection may be provided by the second surface 1022.

In various embodiments, the integrated circuit 100 may include a body 106, e.g. a die pad or a carrier, e.g. a leadframe. The body 106 may include or essentially consist of an electrically conductive composite material 105. The body 106 may have a first surface 1061 on a first side of the body 106, and a second surface 1062 on a second side of the body 106 opposite the first surface 1061. In various embodiments, the first surface 1061 may be patterned. The first surface 1061 may for example include at least one protrusion or at least one opening, e.g. a plurality of protrusions and/or openings, e.g. as shown in FIG. 1. Thereby, in various embodiments, a surface area of the first surface 1061 of the body 106, e.g. of the carrier, may be increased, e.g. for providing a larger cooling surface, e.g. a cooling surface facing away from the semiconductor chip 102, e.g. towards an outside. In various embodiments, none of the surfaces of the body 106 may be patterned, or the first surface 1061 and the second surface 1062 of the body 106 may be patterned.

In various embodiments, the electrically conductive composite material 105 may include a metal and particles, e.g. ceramic particles, carbon particles and/or metal particles, influencing a plurality of parameters of the metal. For example, as compared to the metal, a CTE value may be lowered. Furthermore, an electrical and/or thermal conductivity may be lowered.

In various embodiments, the electrically conductive composite material 105 may be formed as a molding compound, e.g by molding, e.g. injection molding, transfer molding or compression molding, a compound of at least the metal component and the second (e.g. ceramic, carbon and/or metal) component. In various embodiments, the electrically conductive composite material 105 may be formed by sintering, e.g. laser sintering, e.g. by sintering at least the metal component and the second component. In various embodiments, the electrically conductive composite material 105 may be formed by plating, e.g. by electroplating, for example by forming the metallic component on a surface, e.g. on surfaces of small particles, of the second component. In various embodiments, the electrically conductive composite material 105 may be formed by deposition, e.g. by physical or chemical vapor deposition, of the metallic component on a surface, e.g. on surfaces of small particles, of the second component.

In various embodiments, the body 106 including the electrically conductive composite material 105 may be formed using, for example, injection molding, compression molding, sintering or plating.

In various embodiments, the electrically conductive composite material 105, e.g. the body 106, may have a thickness 106T in a range from about 50 µm to about 2 mm, e.g. from about 100 µm to about 1 mm.

In various embodiments, in the integrated circuit 100, the semiconductor chip 102, e.g. the second surface 1022 of the chip 102, may be fixed to the electrically conductive composite material 105, e.g. to the body 106. The chip 102 may for example be fixed to the second surface 1062 (e.g. an essentially flat surface) of the body 106, e.g. to a portion of the body 106 that includes the composite material 105. The chip 102 may be bonded to the electrically conductive composite material 105. In various embodiments, substantially all of the second surface 1022 of the chip 102 may be fixed to the body 106, e.g. be fixed on the body 106, e.g the composite material 105 of the body 106.

In various embodiments, a bonding layer 104 may be used for attaching the semiconductor chip 102, e.g. to the body 106. Any suitable known methods of fixing the chip 102 to the body 106, e.g. attaching the chip 102 on the body 106, may be used, for example attaching the chip 102 using an adhesive bonding layer material 104 (which may be electrically and/or thermally conductive, for example its electrical and/or thermal conductivity may be comparable to the electrical and/or thermal conductivity of the composite material 105, or may be electrically insulating), diffusion soldering, soldering, and the like.

In various embodiments, the material of the bonding layer 104 may be or include a solder, e.g. a diffusion solder, e.g. a gold/tin diffusion solder, an electrically conductive glue, or the like. The bonding layer 104 may have a thickness in a range from about 10 nm to about 10 µm, e.g. from about 20 nm to about 1 µm, e.g. about 100 nm. In various embodiments, the bonding layer 104 may have a different thickness.

The bonding layer 104 may, in various embodiments, be formed as a partial or complete layer of bonding layer material that may be arranged between the semiconductor chip 102 and the composite material 105, e.g. the body 106 including the composite material 105. In various embodiments, the bonding layer 104 may be more flexible, e.g. more elastic, than the semiconductor material and/or the composite material 105, and/or a thickness of the bonding layer 104 may be very small, and/or its coefficient of thermal expansion may be similar to the CTE of the semiconductor material or to the CTE of the composite material 105. In this way, a differential motion between the bonding layer 104 and the semiconductor material and the composite material 105 attached to it, respectively, which may be caused by a temperature change of the integrated circuit 100, may be insignificant, for example because the CTEs of the materials are matched (at least approximately), and/or because the bonding layer 104 is too thin and/or too flexible to move relative to the semiconductor material and/or the composite material 105.

In various embodiments, the electrically conductive composite material 105 may include a metal, which may in the following also be referred to as the metal component or the metallic component, and a second material, which may herein also be referred to as the second component. The metal may for example be at least one of a group consisting of copper, silver, aluminum, gold, copper-silver-alloy, copper-zinc-alloy, and copper-tin-alloy. The second component may for example include at least one of a group consisting of a ceramic material, a carbon material, e.g. a carbon allotrope, a metal, or a different, e.g. solid, inorganic material. The second component may for example be at least one of a group consisting of a carbon allotrope, e.g. graphite, graphene, diamond or carbon nanotubes, silicon, silicon carbide, silicon nitride, silicon oxide, aluminum nitride, boron nitride, molybdenum, and aluminum oxide. Alternatively, the metal component may include or essentially consist of a different metal, and/or the second component may include or essentially consist of a different, e.g. ceramic, material.

In various embodiments, the composite material may include at least one of a group of material combinations, the group consisting of aluminum and graphite; a metal and carbon nanotubes; a metal and graphene; a metal and diamond; copper and a ceramic material; a metal and molybdenum, e.g. molybdenum particles, e.g. molybdenum powder; a metal and silicon carbide; a metal and silicon nitride; a metal and aluminum nitride; a metal and silicon; a metal and silicon oxide; a metal and boron nitride; and a metal and aluminum oxide. The metal of the material combinations may for example be selected from the group listed above for the metal component. Alternatively, it may be or include a different metal. The second material of the material combinations may be selected from the above group listed for the second component. Alternatively, it may be or include a different material.

In various embodiments, a CTE of the second component may be lower than a CTE of the metal component. In various embodiments, the CTE of the second component may be lower than about $12 \times 10^{-6}$/K, e.g. in a range from about $1 \times 10^{-6}$/K to about $10 \times 10^{-6}$/K, e.g. from about $2 \times 10^{-6}$/K to about $8 \times 10^{-6}$/K.

In various embodiments, the electrically conductive composite material 105 may have a coefficient of thermal expansion (CTE) value smaller than or equal to about $12 \times 10^{-6}$/K.

In various embodiments, a specific combination of materials may be selected to obtain a pre-defined CTE in the electrically conductive composite material 105. In various embodiments, a relative amount of the metal and of the second material may be adjusted to obtain a pre-defined CTE.

In various embodiments, a difference between the pre-defined CTE and a CTE of a semiconductor material of the semiconductor chip 102 may be smaller than about $8 \times 10^{-6}$/K, for example smaller than about $4 \times 10^{-6}$/K.

In various embodiments, the integrated circuit 100 may include the semiconductor chip 102 including the semiconductor material, and the electrically conductive composite material 105 fixed to the semiconductor chip 102, wherein the difference ΔCTE (semiconductor, composite) between the coefficient of thermal expansion of the electrically conductive composite material 105 and the coefficient of thermal expansion of the semiconductor material may be smaller than or equal to about 10, e.g. smaller than or equal to about 8, smaller than or equal to about 5.

In various embodiments, an electrical conductivity and/or a thermal conductivity of the metal component may be higher than an electrical conductivity and/or a thermal conductivity of the second component. In various other embodiments, the electrical and/or thermal conductivity of the second component may be as high as the electrical and/or thermal conductivity of the metal, or even higher.

In various embodiments, an electrical conductivity of the composite material is higher than an electrical conductivity of the second component and/or a thermal conductivity of the composite material is higher than a thermal conductivity of the second component.

In various embodiments, the thermal conductivity of the composite material 105 may be higher than about 35 W/mK, e.g. higher than about 100 W/mK, e.g. higher than about 200 W/mK.

In various embodiments, a lower limit for the thermal and/or electrical conductivity of the electrically conductive composite material 105 may be defined considering an intended application, e.g. considering where the electrically conductive composite material 105 may be fixed to, and/or which amount of current (thermal or electrical) may need to be transmitted by the composite material. The type of metal and/or the type of second material and/or their relative amounts may be selected and/or adjusted such that the lower limit for the thermal and/or electrical conductivity of the composite material 105 may be reached or exceeded, and such that the CTE of the electrically conductive composite material 105 may be lower than the CTE of the metal, for example such that the CTE value may lie between the CTE value for the metal and the CTE value for the semiconductor material of the semiconductor chip 102. In other words, a difference ΔCTE (semiconductor, composite) between the CTE of the semiconductor material of the semiconductor chip 102 and the composite material 105 may be smaller than a difference ΔCTE (semiconductor, metal) between the CTE of the semiconductor material of the semiconductor chip 102 and the metal included in the electrically conductive composite material 105.

In various embodiments, an upper limit for the CTE of the electrically conductive composite material 105 or of the difference ΔCTE (semiconductor, composite) between the CTE of the semiconductor material of the semiconductor chip 102 and the composite material 105 may be defined considering an intended application, e.g. considering where the electrically conductive composite material 105 may be fixed to, and/or which amount of current (thermal or electrical) may need to be transmitted by the electrically conductive composite material 105. The type of metal and/or the type of second material and/or their relative amounts may be selected and/or adjusted such that the upper limit for the CTE of the electrically conductive composite material 105 or of the difference ΔCTE (semiconductor, composite) may be reached or stayed below, and such that the thermal and/or electrical conductivity may be higher than the thermal and/or electrical conductivity of the second material included in the electrically conductive composite material 105.

In other words, the electrically conductive composite material 105 may provide a compromise between a good thermal and/or electrical conductivity and a small difference of the coefficient of thermal expansion between the semiconductor material of the semiconductor chip 102 and a material fixed to the semiconductor material to provide an electrically and/or thermally conductive connection. Depending on an intended application, the materials (metal and second material, e.g. ceramic, carbon, metal or other inorganic solid material, e.g. silicon) included in the electrically conductive composite material 105 may be selected and their relative amount adjusted for either obtaining a balance between conductivity and difference in the CTE, or for sacrificing some of the conductivity in favour of a smaller difference in the CTE, or vice versa.

In various embodiments, an increase in the relative amount of metal in the composite material 105 with respect to the second material may increase the electrical and/or thermal conductivity, and increase the difference ΔCTE (semiconductor, composite). In various embodiments, an increase in the relative amount of the second material in the composite material 105 with respect to the metal may lower the difference ΔCTE (semiconductor, composite) and decrease the electrical and/or thermal conductivity.

In various embodiments, the electrically conductive composite material 105 may include a CTE gradient. The CTE gradient may be formed in the electrically conductive composite material 105 in such a way that the CTE may be closest to the CTE of the semiconductor material of the semiconductor chip 102 (in other words, ΔCTE (semiconductor, composite) may be smallest), which typically may correspond to the lowest CTE, in a portion of the composite material 105 to be fixed to the semiconductor chip 102, e.g. in a portion of the body 106, e.g. at or near the second surface 1062 of the body 106 of FIG. 1. The CTE may deviate farther from the CTE of the semiconductor material of the semiconductor chip 102 (in other words, ΔCTE (semiconductor, composite) may be larger), which typically may correspond to a higher CTE, in a further portion of the electrically conductive composite material 105 away from the portion of the composite material 105 to be fixed to the semiconductor chip 102, e.g. in a portion of the body 106, e.g. at or near the first surface 1061 of the body 106 of FIG. 1.

In various embodiments, the electrically conductive composite material 105 with the CTE gradient may provide a possibility to match the CTE of the electrically conductive composite material 105 closely to the CTE of the semiconductor material at the portion to be fixed to the semiconductor chip 102, but at the same time to improve the thermal and/or electrical conductivity of the composite material 105, e.g. of the body 106, further by including more metal (with, e.g., the higher thermal and/or electrical conductivity) in the electrically conductive composite material 105 away from the portion to be fixed to the semiconductor chip 102.

In various embodiments, the electrically conductive composite material 105 may form a die pad. In various embodiments, the electrically conductive composite material 105 may form a leadframe.

In various embodiments, over the body 106, a metal layer 108 may be formed. The metal layer 108 may include or essentially consist of at least one metal or metal alloy, e.g. silver, titanium, copper, or the like. The metal layer 108 may be configured to have an electrically conductive connection attached thereto. In FIG. 1, the electrically conductive connection may be the connection provided by the bonding layer 104. However, the electrically conductive connection may include or essentially consist of other types of connection and/or other connected elements (see e.g. FIG. 2, where the metal layer 108 may be used for connecting an integrated circuit 200 to an outside of the integrated circuit 200), for example bonding wires may be soldered to the bonding layer 104, etc.

The metal layer 108 may have a thickness in a range from about 10 nm to about 10 μm, e.g. from about 20 nm to about 1 μm, e.g. about 100 nm. In various embodiments, the metal layer 108 may have a different thickness.

The metal layer 108 may, in various embodiments, be formed as a partial or complete metal layer 108 that may be arranged over at least one side of the electrically conductive composite material 105, e.g. over the second surface of the body 106.

In various embodiments, the metal layer 108 may be more flexible, e.g. more elastic, than the semiconductor material and/or the electrically conductive composite material 105, and/or a thickness of the metal layer 108 may be very small, and/or its coefficient of thermal expansion may be similar to the CTE of the semiconductor material or to the CTE of the electrically conductive composite material 105. In this way, a differential motion between the metal layer 108 and the semiconductor material and the electrically conductive composite material 105 attached to it, respectively, which may be caused by a temperature change of the integrated circuit 100, may be insignificant, for example because the CTEs of the materials are matched (at least approximately), and/or because the metal layer 108 is too thin and/or too flexible to move relative to the semiconductor material and/or the electrically conductive composite material 105.

Figure 2:
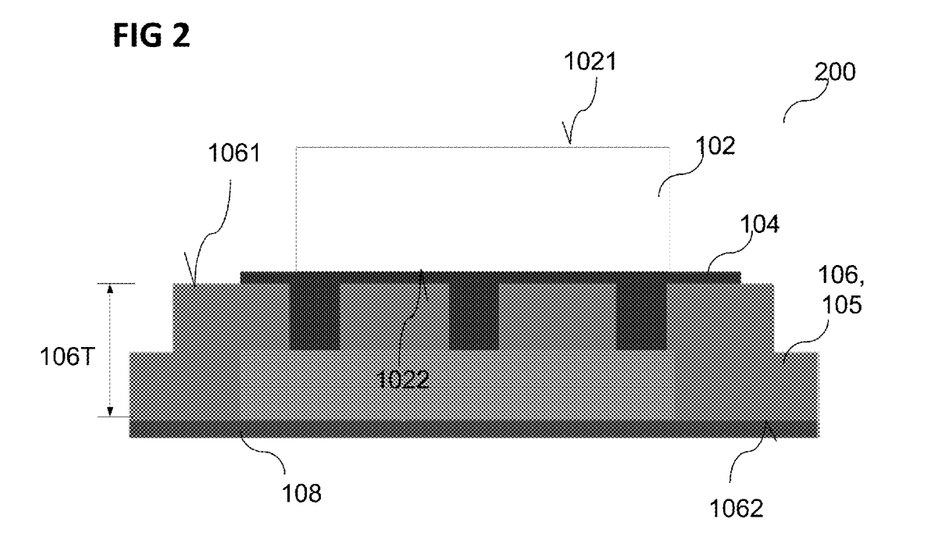
FIG. 2 shows an integrated circuit in accordance with various embodiments.

FIG. 2 shows an integrated circuit 200 in accordance with various embodiments.

The description in context with FIG. 1, e.g. parts, materials, parameters, etc. may mostly also apply to the integrated circuit 200 of FIG. 2. By way of example, a semiconductor chip 102, an electrically conductive composite material 105, a body 106, a metal layer 108 and a bonding layer 104 may be similar or identical to those described above.

In contrast to the integrated circuit 100 of FIG. 1, the semiconductor chip 102 of the integrated circuit 200 of FIG. 2 may be fixed to the first surface 1061 of the body 106, e.g. to the structured surface 1061 of the body 106.

In various embodiments, for example when fixing the semiconductor chip 102 to the first surface 1061 of the body 106, the at least one protrusion or at least one opening formed in the body 106 including the composite material 105 may provide a space for receiving a material, e.g. a bonding layer material, e.g. a solder, used for fixing the chip 102 to the composite material 105. In other words, an anchoring structure for connecting the composite material 105, e.g. the body 106, to another element, e.g. the semiconductor chip 102, may be provided.

Figure 3A:
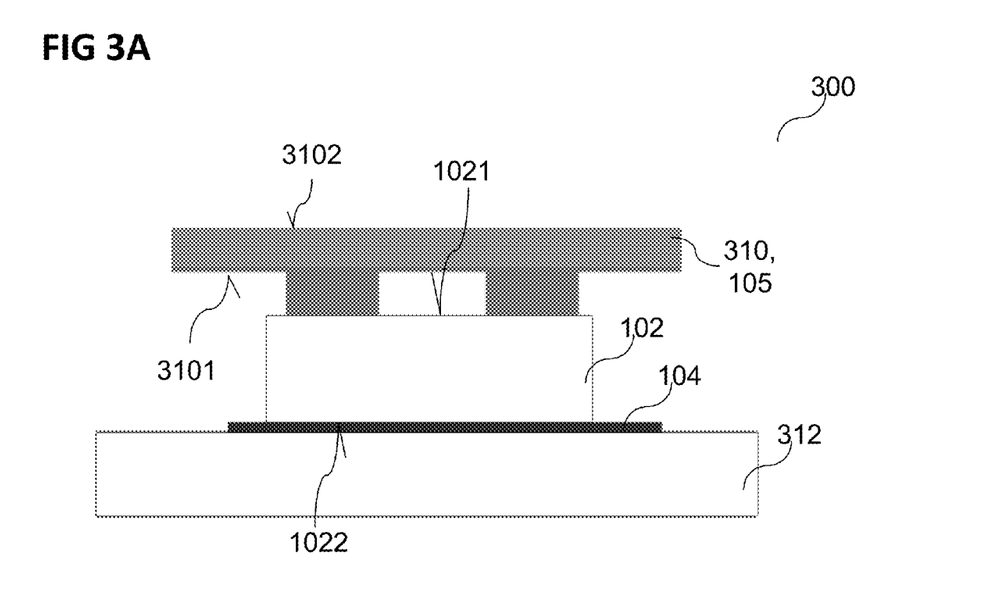
FIGS. 3A and 3B show an integrated circuit in accordance with various embodiments during different stages of its manufacture.
Figure 3B:
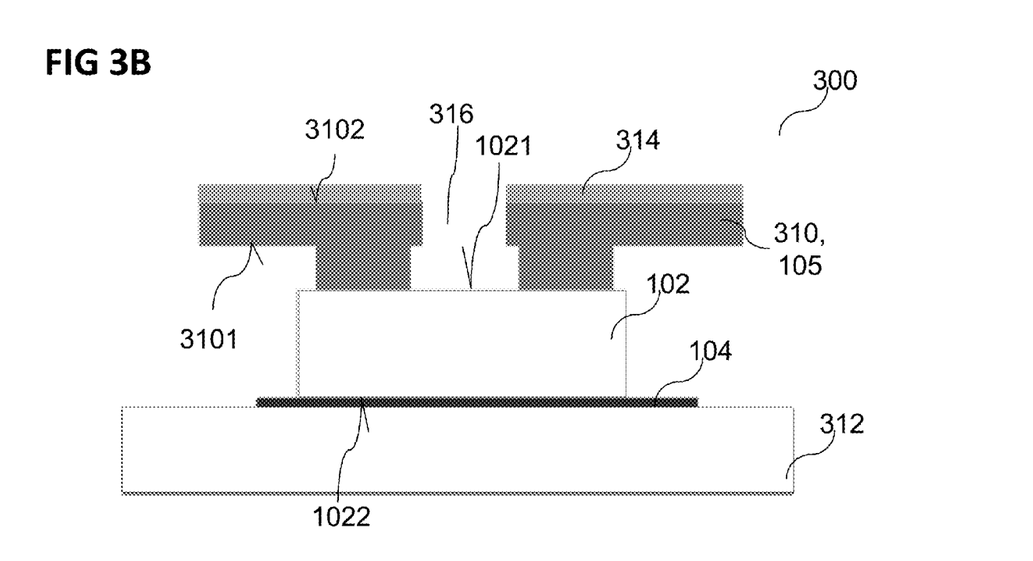

FIGS. 3A and 3B show an integrated circuit 300 in accordance with various embodiments during different stages of its manufacture.

The description in context with FIG. 1 and FIG. 2, e.g. parts, materials, parameters, etc. may mostly also apply to the integrated circuit 300 of FIGS. 3A and 3B. For example, a semiconductor chip 102, an electrically conductive composite material 105, and a bonding layer 102 may be similar or identical to those described above.

In various embodiments, the electrically conductive composite material 105 may form at least one chip front side interconnect 310, e.g. a plurality of chip front side interconnects 310, e.g. a chip front side interconnect structure. In other words, the electrically conductive composite material 105 may be configured to provide an electrically conductive connection to the first side, e.g. the first surface 1021, of the semiconductor chip 102. Here, a structured (patterned) surface of the chip front side interconnect 310 facing the chip may be referred to as a first surface 3101 on a first side of the chip front side interconnect 310, and a surface of the chip front side interconnect 310 opposite the first surface of the chip front side interconnect 310 may be referred to as a second surface 3102 of the chip front side interconnect 310. The second surface 3102 of the chip front side interconnect 310 may be located on a second side of the chip front side interconnect 310.

In various embodiments, the electrically conductive composite material 105 may not be fixed to the complete first surface 1021 of the semiconductor chip 102. Instead, the electrically conductive composite material 105 may be formed to essentially only be fixed to electrical contacts (not shown) formed in or on the first surface 1021 of the semiconductor chip 102, thereby forming the at least one chip frontside interconnect 310, e.g. the plurality of chip front side interconnects 310, e.g. the chip frontside interconnect structure.

In various embodiments, the electrically conductive composite material 105 may be formed as an integral part, e.g. using injection molding, compression molding, plating or sintering (see FIG. 3A). Thereafter (see FIG. 3B), e.g. in the case of the at least one chip front side interconnect 310 including the plurality of chip front side interconnects 310, at least one electrically insulating opening 316, e.g. a plurality of electrically insulating openings, may be formed between the individual chip front side interconnects 310 of the plurality of chip front side interconnects 310, for example using an etching process.

In various embodiments, a mask layer 314, e.g. a structured mask layer, may be applied to the electrically conductive composite material 105, e.g. to the at least one chip front side interconnect 310. The mask layer 314 may be formed over the second surface 3102 of the chip front side interconnect 310. The mask layer 314 may act as an etch stop during the etching process for etching the at least one electrically insulating opening 316. The mask layer 314 may be structured such that an etching of the integrated circuit 300 with the mask layer 314 may remove the electrically conductive composite material 105 around the at least one chip front side interconnect 310. The mask layer 314 may include or essentially consist of a metal and/or a metal alloy. The mask layer 314 may for example include or essentially consist of indium/tin, gold or a gold alloy, silver or a silver alloy, or the like. In the case of the mask layer 314 including metal, the mask layer 314 may remain after the etching and may be used for providing an electrically conductive connection to the semiconductor chip 102 through the at least one chip front side interconnect 310. In other words, the mask layer 314 may serve a dual purpose as an etch stop and as a metallization, e.g. a metallization, e.g. a selective metallization, of the at least one chip front side interconnect 310. Alternatively or additionally, the mask layer 314 may serve as a protective layer and/or as a connection layer.

In various embodiments, the electrically conductive composite material 105 may be formed directly as the plurality of individual chip frontside interconnects 310.

In various embodiments, the electrically conductive composite material 105 may act as a heat sink and/or as a structure for storing heat, while at the same time providing the chip frontside interconnect 310.

In various embodiments, the integrated circuit 300 may include a carrier 312. The semiconductor chip 102 of the integrated circuit 300 may be attached to the carrier 312. The carrier 312 may, in various embodiments, be any kind of suitable carrier 312. The carrier 312 may for example be or include an at least partially electrically conductive carrier 312, e.g. a metal carrier, a carrier including the electrically conductive composite material 105, a doped semiconductor, a polymer carrier including electrically conductive portions, or the like. The carrier 312 may for example be a leadframe. The carrier 312 may for example be or include an at least partially electrically insulating carrier 312, e.g. a ceramics carrier, a glass carrier, a polymer carrier, or the like.

The semiconductor chip 102 may be attached to the carrier 312 using a bonding layer 104, e.g. the bonding layer 104 as described above.

In various embodiments, the above description for the electrically conductive composite material 105 forming a front side interconnect 310 may similarly apply for the electrically conductive composite material 105 forming a back side interconnect (not shown).

In various embodiments, for forming the front side interconnect 310 and/or for the back side interconnect, the electrically conductive composite material 105, the plating and/or the deposition, e.g. as described above, may be used.

Figure 4A:
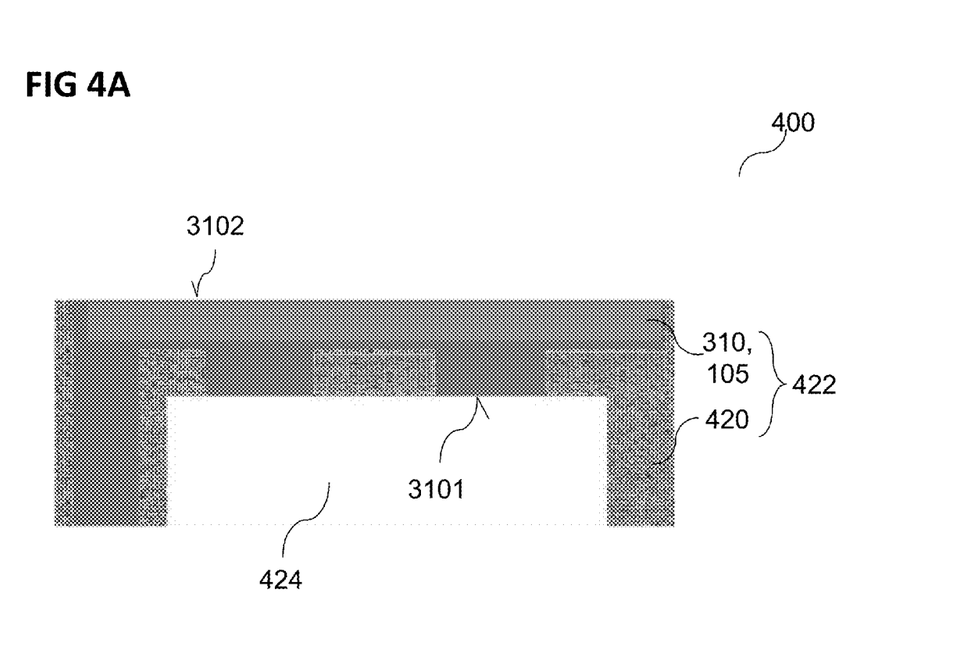
FIGS. 4A and 4B show an integrated circuit in accordance with various embodiments during different stages of its manufacture.
Figure 4B:
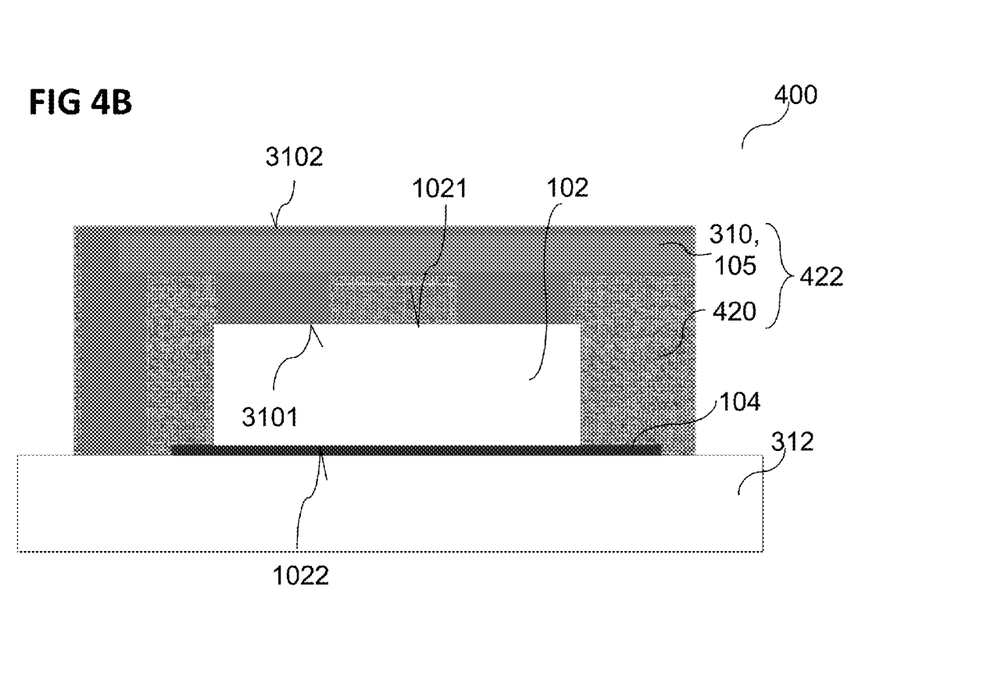

FIGS. 4A and 4B show an integrated circuit 400 in accordance with various embodiments during different stages of its manufacture.

The description in context with FIG. 1 to FIG. 3B, e.g. parts, materials, parameters, etc. may mostly also apply to the integrated circuit 400 of FIGS. 4A and 4B. by way of example, a semiconductor chip 102, an electrically conductive composite material 105, and a bonding layer 102 may be similar or identical to those described above.

In various embodiments, the integrated circuit 400 may include encapsulation material 420 to at least partially encapsulate the semiconductor chip 102 (see FIG. 4A) and/or at least partially encapsulating the semiconductor chip 102 (see FIG. 4B).

The encapsulation material 420 may include or essentially consist of any suitable encapsulation material 420, for example an insulating encapsulation material, for example material typically used for encapsulating semiconductor chips, for example a polymer, e.g. a resin, or a ceramic material.

In various embodiments, the electrically conductive composite material 105 and the encapsulation material 420 may be joined to form an encapsulation 422 of the semiconductor chip 102. In other words, in various embodiments, the electrically conductive composite material 105 may form at least part of the encapsulation 422 including the encapsulation material 420.

In various embodiments, e.g. as shown in FIG. 4A, the encapsulation 422 may be pre-formed. In other words, the encapsulation 422 including the electrically conductive composite material 105 and the encapsulation material 420 may be formed as an individual part to be joined with the semiconductor chip 102. For example, but not limited to this, the encapsulation 422 may be pre-formed in a case where the forming of the electrically conductive composite material 105 may require a processing temperature that may not be tolerated by other parts, e.g. the semiconductor chip 102, of the integrated circuit 400. For example, the forming of the electrically conductive composite material 105 may include melting of the metal component of the electrically conductive composite material 105, which may not be carried out while the metal component is in physical contact with the heating furnace.

The encapsulation 422 may for example be formed by forming the electrically conductive composite material 105, e.g. the at least one chip front side interconnect 310 e.g. as described above. The formed electrically conductive composite material 105, e.g. the at least one chip front side interconnect 310, may then be placed in a mold (not shown). The mold may define a shape of the encapsulation to be formed. The mold may further be shaped to reserve a space 424 at least for the semiconductor chip 102 to be inserted in the encapsulation 422. At least one space in the mold, e.g. adjacent to the electrically conductive composite material 105, e.g. the at least one chip front side interconnect 310, may be at least partially filled with the encapsulation material 420. The encapsulation material 420 may in various embodiments include or essentially consist of a polymer, for example a pre-cured polymer, which may also be referred to as a partially cured polymer or as a b-stage polymer. In various embodiments, the encapsulation 422 may include portions, e.g. surface portions, of the electrically conductive composite material 105, and portions, e.g. surface portions, of the encapsulation material 420, e.g. the polymer, e.g. the pre-cured polymer. The electrically conductive composite material 105, e.g. at least one of the surface portions of the encapsulation 422 including the electrically conductive composite material 105, may be arranged in a region (or regions) of the encapsulation where an electrically conductive connection, e.g. to the semiconductor chip 102, may be desired.

The encapsulation material 420, e.g. the polymer, e.g. the pre-cured polymer, may be arranged in a region (or regions) of the encapsulation where an electrically insulating connection, e.g. an insulation from the semiconductor chip 102, may be desired.

In various embodiments, the pre-formed encapsulation 422 may then be joined with the semiconductor chip 102. The semiconductor chip 102 may be inserted in the space 424 reserved by the mold (see FIG. 4B). During and/or after inserting the semiconductor chip into the space 424, an electrically conductive connection between the semiconductor chip 102 and the electrically conductive composite material 105, e.g. the chip front side interconnect 310, may be formed, e.g. by soldering, e.g. diffusion soldering.

In various embodiments, a final curing, e.g. including heating to a temperature in a range from about 100° C. to about 200° C., may be applied to the encapsulation 422.

In various embodiments, the chip 102 may be connected, either before the inserting into the encapsulation 422 or thereafter, to a carrier 312, which may for example be similar or identical to the carrier 312 from FIG. 3A or FIG. 3B, e.g. using a bonding layer 104, e.g. as described above.

In various embodiments, a mask layer, for example a mask layer similar or identical to the mask layer 314 described in the context with FIG. 3B, may be formed over the encapsulation 422, for example over a surface of the encapsulation 422 facing away from the chip 102, for example the surface of the encapsulation 422 including the second surface of the chip front side interconnect 310. As described above, the mask layer may be used for selectively etching the electrically conductive composite material 105. The etching process may be carried out for singulating individual chip front side interconnects, e.g. as described in context with FIG. 3B. Insulating portions between the individual chip front side interconnects 310 may in various embodiments be formed or partially be formed by the encapsulation material 420.

In various embodiments, it may not be required to apply an additional encapsulation for encapsulating the integrated circuit 400. However, in various embodiments, an additional encapsulation (not shown) may additionally be formed.

In various embodiments (not shown), the electrically conductive composite material 105 may be formed, e.g. as at least part of the encapsulation 422 of the chip 102, by forming, e.g. molding, the electrically conductive composite material 105 directly on/around the chip 102, e.g. without first forming a pre-molded encapsulation 422.

Figure 5A:
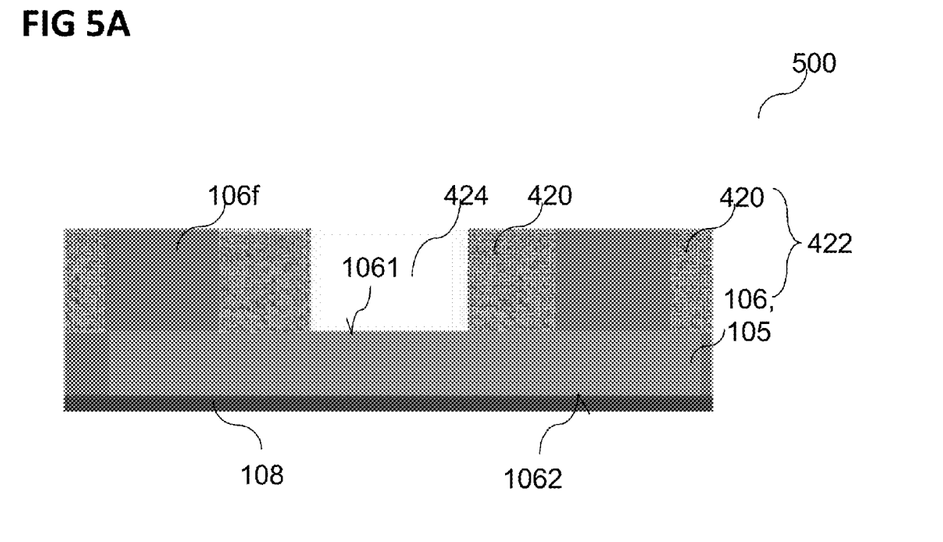
FIGS. 5A and 5B show an integrated circuit in accordance with various embodiments during different stages of its manufacture.
Figure 5B:
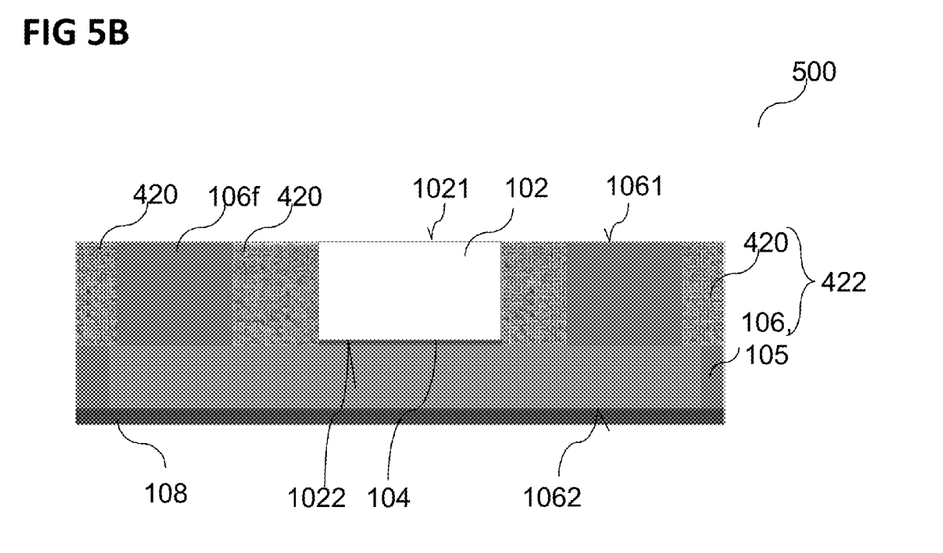

FIGS. 5A and 5B show an integrated circuit 500 in accordance with various embodiments during different stages of its manufacture.

The description in context with FIG. 1 to FIG. 4B, e.g. parts, materials, parameters, etc. may mostly also apply to the integrated circuit 500 of FIGS. 5A and 5B. By way of example, a semiconductor chip 102, an electrically conductive composite material 105, an encapsulation material 420, a metal layer 108, and a bonding layer 102 may be similar or identical to those described above.

In various embodiments, the integrated circuit 500 may include encapsulation material 420 to at least partially encapsulate the semiconductor chip 102 (see FIG. 5A) and/or at least partially encapsulating the semiconductor chip 102 (see FIG. 5B).

The integrated circuit 500 may differ from the various embodiments described in context with FIGS. 4A and 4B for example in that the electrically conductive composite material 105 may form a body 106, which may be similar or identical to the body 106 described in context with FIGS. 3A and 3B, e.g. a carrier, e.g. a leadframe, and in that the encapsulation 422 may include the body 106 (including or consisting of the electrically conductive composite material 105), and the encapsulation material 420.

The body 106 may be configured to be connected to the second surface 1022 of the semiconductor chip 102.

As shown in FIG. 5B, the semiconductor chip 102 may be inserted in the space 424 reserved by the mold (see FIG. 5B). During and/or after inserting the semiconductor chip into the space 424, an electrically conductive connection between the semiconductor chip 102 and the electrically conductive composite material 105, e.g. the body 106, may be formed, e.g. by soldering, e.g. diffusion soldering, for example using a bonding layer 104, which may be similar or identical to the bonding layer 104 described above.

In various embodiments, the body 106 may be formed to include at least one protrusion 106f. In contrast to the at least one opening or the at least one protrusion of FIG. 1 and/or FIG. 2, the at least one protrusion 106f may be formed to extend beyond the surface of the semiconductor chip 102 with which the semiconductor chip 102 may be fixed to the electrically conductive compound material 105, e.g. the body 106.

In various embodiments, the encapsulation material 420 and the first side of the semiconductor chip 1021 may form a common, e.g. essentially flat, surface. The encapsulation material 420, the electrically conductive composite material 105 (e.g. in a region of the at least one protrusion 106f) and the first side 1021 of the semiconductor chip 102 may form a common, e.g. essentially flat, surface. In various embodiments, a front side contact to the back side 1022 of the semiconductor chip 102 may thus be provided, e.g. by the first surface 1061 of the body 106 in the region of the at least one protrusion 106f.

In various embodiments, on the common surface, a chip front side interconnect (not shown) may be formed, e.g. a chip front side interconnect including a metal or a metal alloy, a doped semiconductor, and/or the electrically conductive composite material in accordance with various embodiments.

An additional encapsulation may be applied to the integrated circuit 500, e.g. an additional encapsulation encapsulating the semiconductor chip 102 over its first side, e.g. after forming the chip front side interconnect.

Figure 6:
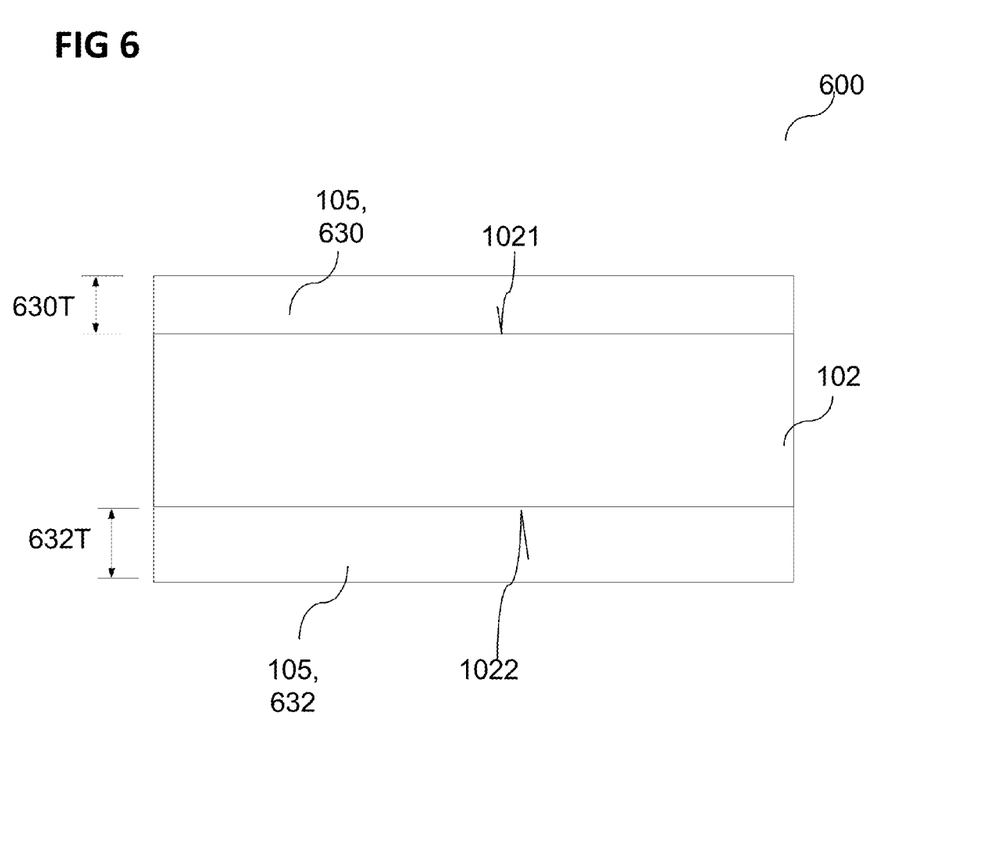
FIG. 6 shows an integrated circuit in accordance with various embodiments.

FIG. 6 shows an integrated circuit 600 in accordance with various embodiments.

The description in context with FIG. 1 to FIG. 5B, e.g. parts, materials, parameters, etc. may mostly also apply to the integrated circuit 600 of FIG. 6. For example, a semiconductor chip 102 and an electrically conductive composite material 105 may be similar or identical to those described above.

In various embodiments, the electrically conductive composite material 105 may be formed over the first surface 1021 and over the second surface 1022 of the semiconductor chip 102. The electrically conductive composite material 105 may be fixed to, e.g. on, the first surface 1021 and to, e.g. on, the second surface 1022 of the semiconductor chip 102. The electrically conductive composite material 105 may form a first layer 630 over the first surface 1021 and a second layer 632 over the second surface 1022 of the semiconductor chip 102. In other words, the electrically conductive composite material 105 may be fixed to a first side of the chip 102 (on which the first surface 1021 may be formed) and to a second side of the chip 102 (on which the second surface 1022 may be formed) opposite the first side.

In various embodiments, the first layer 630 and the second layer 632 of the electrically conductive composite material 105 may be thick layers 630, 632. For example, a thickness 630T of the first layer 630 and/or a thickness 632T of the second layer 632 may be in a range from about 50 μm to about 2 mm, e.g. from about 100 μm to about 1 mm.

In various embodiments, the composite material 105, e.g. the first layer 630 and/or the second layer 632, may act as a heat buffer.

In various embodiments, measures (not shown) may be applied for avoiding an electrical shortcircuiting of electrical contacts formed on the semiconductor chip 102, e.g. in or on the first surface 1021 of the semiconductor chip 102, e.g. insulating structures may be formed, and electrically conductive connections to the electrical contacts may be formed, e.g. within the insulating structures.

In various embodiments, the fixing of the electrically conductive composite material 105 to both, the first surface 1021 and the second surface 1022 of the semiconductor chip 102 may mean that a bending force that may occur during a temperature change of the integrated circuit 600, e.g. during a cool-down after manufacture or during a temperature increase during operation of the integrated circuit 600, due to a residual mismatch in CTE between the semiconductor material of the semiconductor chip 102 and the electrically conductive composite material 105 fixed to, e.g., the first surface 1021 of the semiconductor chip 102 may be counteracted by an equal or a similar counterforce due to a residual mismatch in CTE between the semiconductor material of the semiconductor chip 102 and the electrically conductive composite material 105 fixed to the second surface 1022. As a consequence, the chip 102 may not be bent at all or be bent only slightly during the temperature change.

In various embodiments, high thermomechanical tensions (which may even lead to a breaking or a delamination of a chip), which may be a typical problem encountered in metallized semiconductor chips, e.g. thin semiconductor chips, e.g. gallium nitride chips, due to a large difference in CTE between the semiconductor chip and the metallizations, may be avoided. Thereby, a manufacture of even thinner semiconductor chips may be made feasible.

In various embodiments, an injection molding may be carried out, e.g. as described above, for applying the electrically conductive composite material 105. Alternatively, any other suitable method, e.g. as described above, may be used for applying the electrically conductive composite material 105.

In various embodiments, the thickness 630T of the electrically conductive composite material 105 fixed to the first side of the chip 102, i.e. of the first layer 630, may be about the same as the thickness 632T of the electrically conductive composite material 105 fixed to the second side of the chip 102, i.e. of the second layer 632. Thereby, a magnitude of the bending force exerted by each of the first side 630 and of the second side 632 may be approximately equalized.

In various embodiments, the electrical conductivity of the electrically conductive composite material 105 may not be exploited. Instead, the thermal conductivity may be exploited, for example by applying the electrically conductive composite material 105, e.g. as shown in FIG. 6, to at least one of the first surface 1021 and the second surface 1022 of the semiconductor chip 102, e.g. to both surfaces 1021, 1022 as a spacer element, e.g. without being electrically connected, for cooling the semiconductor chip 102, e.g. during operation. In a case where the electrically conductive composite material 105 is fixed to both surfaces 1021, 1022, double sided cooling (DSC) may be performed. In various embodiments, the semiconductor chip 102 with the at least one layer 630, 632 of electrically conductive semiconductor material 105 fixed thereto may be arranged between two plates for direct copper bonding (DCB plates), in other words, the the semiconductor chip 102 with the at least one layer 630, 632 of electrically conductive semiconductor material 105 fixed thereto may have each of the layers 630, 632 directly copper bonded to one DCB plate. Thereby, a cooling performance of the semiconductor chip 102 may be improved.

In various embodiments, the semiconductor material of the semiconductor chip 102, e.g. gallium nitride (GaN), may benefit from the high thermal conductivity of the electrically conductive composite material.

Figure 7:
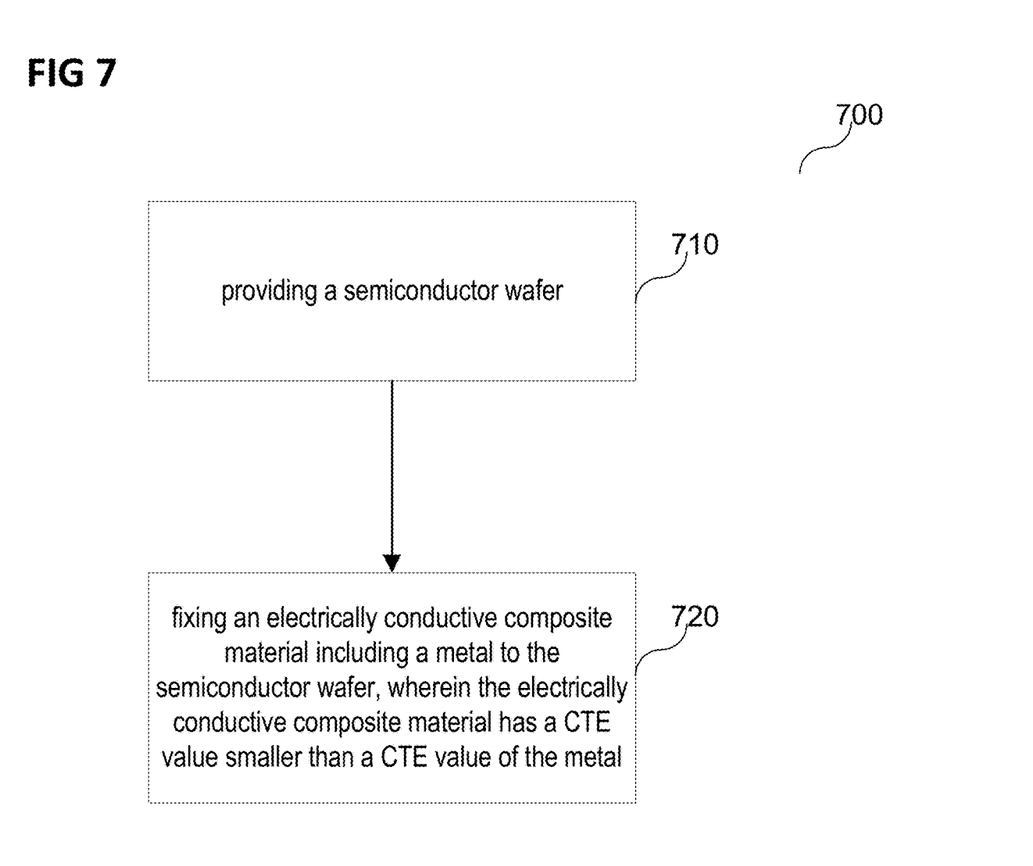
FIG. 7 shows a schematic diagram of a method of manufacturing an integrated circuit in accordance with various embodiments.

FIG. 7 shows a schematic diagram 700 of a method of manufacturing an integrated circuit in accordance with various embodiments.

In various embodiments, a method of manufacturing an integrated circuit may be provided. The method may include providing a semiconductor wafer (in 710); and fixing an electrically conductive composite material including a metal to the semiconductor wafer, wherein the electrically conductive composite material may have a CTE value smaller than a CTE value of the metal (in 720).

In various embodiments, the electrically conductive composite material may have a CTE value smaller than or equal to about $12 \times 10^{-6}$/K.

In various embodiments, the fixing the electrically conductive composite material on the semiconductor wafer may include at least one of soldering, molding, plating, sintering and glueing.

In various embodiments, the fixing the electrically conductive composite material on the semiconductor wafer may include either forming a common boundary layer between the electrically conductive composite material and the semiconductor wafer, or forming an adhesion layer between the electrically conductive composite material and the semiconductor wafer adhering to the electrically conductive composite material and to the semiconductor wafer.

In various embodiments, the method may further include singulating the wafer into individual chips.

In various embodiments, the singulating may include at least one of etching, die cutting, laser ablation, sawing and wire-electro discharge machining.

In various embodiments, an integrated circuit is provided. The integrated circuit may include a semiconductor chip and an electrically conductive composite material fixed to the semiconductor chip, wherein the electrically conductive composite material has a coefficient of thermal expansion (CTE) value smaller than or equal to about $12 \times 10^{-6}$/K.

In various embodiments, an integrated circuit is provided. The integrated circuit may include a semiconductor chip and an electrically conductive composite material fixed to the semiconductor chip, wherein the electrically conductive composite material may include a metal, and wherein a coefficient of thermal expansion (CTE) value of the electrically conductive composite material may be lower than the CTE value of the metal.

In various embodiments, the electrically conductive composite material may have a coefficient of thermal expansion (CTE) value smaller than or equal to about $12 \times 10^{-6}$/K.

In various embodiments, the electrically conductive composite material may further include a second component, the second component including or consisting of at least one of a group of materials, the group consisting of a ceramic material, a carbon material, a metal, and a solid inorganic material different from the above.

In various embodiments, the second component may include or consist of at least one of a group of carbon materials, the group consisting of graphite; carbon nanotubes; graphene; and diamond.

In various embodiments, the second component may include or consist of at least one of a group of ceramic materials, the group consisting of silicon carbide; silicon nitride; aluminum nitride; boron nitride; and aluminum oxide.

In various embodiments, the second component may include or consist of molybdenum.

In various embodiments, the second component may include or consist of silicon.

In various embodiments, the metal may include or consist of aluminum.

In various embodiments, the metal may include or consist of copper.

In various embodiments, the second component may include or consist of graphite.

In various embodiments, the second component may include or consist of a ceramic material.

In various embodiments, the electrically conductive composite material may include a metal or a metal alloy and a ceramic material.

In various embodiments, the composite material may include at least one of a group of material combinations, the group consisting of a metal and carbon; a metal and graphite; aluminum and graphite; a metal and carbon nanotubes; a metal and graphene; a metal and diamond; copper and molybdenum; copper and a ceramic material; a metal and silicon carbide; a metal and silicon nitride; a metal and silicon; a metal and aluminum nitride; a metal and boron nitride; and a metal and aluminum oxide.

In various embodiments, a relative amount of the metal and of the second component is adjusted to obtain a pre-defined CTE.

In various embodiments, a relative amount of the metal or the metal alloy and of the ceramic material may be adjusted to obtain a pre-defined CTE.

In various embodiments, a difference between the pre-defined CTE and a CTE of a semiconductor material of the semiconductor chip may be smaller than about 8.

In various embodiments, the electrically conductive composite material may include a CTE gradient.

In various embodiments, the integrated circuit may further include encapsulation material at least partially encapsulating the semiconductor chip.

In various embodiments, the electrically conductive composite material may form at least part of the encapsulation including the encapsulation material.

In various embodiments, the electrically conductive composite material may form a die pad.

In various embodiments, the electrically conductive composite material may form a chip front side interconnect structure. In various embodiments, the electrically conductive composite material may form a chip back side interconnect structure.

In various embodiments, the electrically conductive composite material may be formed as a molding compound.

In various embodiments, the integrated circuit may further include a bonding layer arranged between the semiconductor chip and the electrically conductive composite material.

In various embodiments, the bonding layer may include a diffusion solder.

In various embodiments, at least one surface of the electrically conductive composite material may include a plurality of protrusions and/or openings.

In various embodiments, the electrically conductive composite material may be fixed to a first side of the chip and to a second side of the chip opposite the first side.

In various embodiments, a thickness of the electrically conductive composite material fixed to the first side may be about the same as a thickness of the electrically conductive composite material fixed to the second side.

In various embodiments, an integrated circuit is provided. The integrated circuit may include a semiconductor chip including a semiconductor material; and electrically conductive composite material fixed to the semiconductor chip, wherein a difference between a coefficient of thermal expansion of the electrically conductive composite material and a coefficient of thermal expansion of the semiconductor material may be smaller than or equal to about $10 \times 10^{-6}$/K.

In various embodiments, an integrated circuit is provided. The integrated circuit may include a semiconductor chip; an encapsulation encapsulating the semiconductor chip; and an electrically conductive composite material, wherein the electrically conductive composite material may include a metal, and wherein a coefficient of thermal expansion (CTE) value of the electrically conductive composite material may be lower than the CTE value of the metal.

In various embodiments, the electrically conductive composite material may form at least part of the encapsulation.

In various embodiments, a method of manufacturing an integrated circuit is provided. The method may include providing a semiconductor wafer; and fixing an electrically conductive composite material having a CTE value smaller than or equal to about $12 \times 10^{-6}$/K to the semiconductor wafer.

In various embodiments, a method of manufacturing an integrated circuit is provided. The method may include providing at least one semiconductor device; and fixing an electrically conductive composite material including a metal to the at least one semiconductor device, wherein the electrically conductive composite material may have a CTE value smaller than a CTE value of the metal.

In various embodiments, the fixing the electrically conductive composite material on the at least one semiconductor device may include at least one of soldering, molding, plating, depositing, sintering and glueing.

In various embodiments, the fixing the electrically conductive composite material on the semiconductor wafer may include at least one of soldering, molding, plating, depositing, sintering and glueing.

In various embodiments, the molding may be at least one of injection molding, pressure molding and transfer molding.

In various embodiments, the fixing the electrically conductive composite material on the at least one semiconductor device may include either forming a common boundary layer between the electrically conductive composite material and the at least one semiconductor device or forming an adhesion layer between the electrically conductive composite material and the at least one semiconductor device adhering to the electrically conductive composite material and to the at least one semiconductor device.

In various embodiments, the fixing the electrically conductive composite material on the semiconductor wafer may include either forming a common boundary layer between the electrically conductive composite material and the semiconductor wafer or forming an adhesion layer between the electrically conductive composite material and the semiconductor wafer adhering to the electrically conductive composite material and to the semiconductor wafer.

In various embodiments, the at least one semiconductor device may include a plurality of semiconductor devices, and the method may further include singulating the plurality of semiconductor devices into individual semiconductor devices.

In various embodiments, the method may further include singulating the wafer into individual chips.

In various embodiments, the singulating may include at least one of etching, die cutting, laser ablation, sawing and wire-electro discharge machining.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
a semiconductor chip; and
electrically conductive composite material fixed to the semiconductor chip,
wherein the electrically conductive composite material comprises a metal, and
wherein a coefficient of thermal expansion (CTE) value of the electrically conductive composite material is lower than the CTE value of the metal.

2. The integrated circuit of claim 1,
wherein the electrically conductive composite material has a coefficient of thermal expansion (CTE) value smaller than or equal to about $12 \times 10^{-6}$/K.

3. The integrated circuit of claim 1,
wherein the electrically conductive composite material further comprises a second component, the second component including or consisting of at least one of a group of materials, the group consisting of
a ceramic material;
a carbon material;
a metal; and
a solid inorganic material different from the above.

4. The integrated circuit of claim 3,
wherein the second component includes or consists of at least one of a group of carbon materials, the group consisting of
graphite;
carbon nanotubes;
graphene; and
diamond.

5. The integrated circuit of claim 3,
wherein the second component includes or consists of at least one of a group of ceramic materials, the group consisting of
silicon carbide;
silicon nitride;
aluminum nitride;
boron nitride; and
aluminum oxide.

6. The integrated circuit of claim 3,
wherein the second component includes or consists of molybdenum.

7. The integrated circuit of claim 3,
wherein the second component includes or consists of silicon.

8. The integrated circuit of claim 3,
wherein the metal includes or consists of aluminum.

9. The integrated circuit of claim 3,
wherein the metal includes or consists of copper.

10. The integrated circuit of claim 8,
wherein the second component includes or consists of graphite.

11. The integrated circuit of claim 8,
wherein the second component includes or consists of a ceramic material.

12. The integrated circuit of claim 8,
wherein the second component includes or consists of molybdenum.

13. The integrated circuit of claim 3,
wherein a relative amount of the metal and of the second component is adjusted to obtain a pre-defined CTE.

14. The integrated circuit of claim 1,
wherein the electrically conductive composite material comprises a CTE gradient.

15. The integrated circuit of any of claim 1, further comprising:
encapsulation material at least partially encapsulating the semiconductor chip.

16. The integrated circuit of claim 15,
wherein the electrically conductive composite material forms at least part of the encapsulation comprising the encapsulation material.

17. The integrated circuit of any of claim 1,
wherein the electrically conductive composite material forms a die pad.

18. The integrated circuit of claim 1,
wherein the electrically conductive composite material forms a chip front side interconnect structure.

19. The integrated circuit of claim 1,
wherein the electrically conductive composite material forms a chip back side interconnect structure.

20. The integrated circuit of claim 1,
further comprising a bonding layer arranged between the semiconductor chip and the electrically conductive composite material.

21. The integrated circuit of claim 1,
wherein at least one surface of the electrically conductive composite material comprises a plurality of protrusions and/or openings.

22. The integrated circuit of claim 1,
wherein the electrically conductive composite material is fixed to a first side of the chip and to a second side of the chip opposite the first side.

23. An integrated circuit, comprising:
a semiconductor chip;
an encapsulation encapsulating the semiconductor chip; and
electrically conductive composite material;
wherein the electrically conductive composite material comprises a metal, and
wherein a coefficient of thermal expansion (CTE) value of the electrically conductive composite material is lower than the CTE value of the metal.

24. The integrated circuit of claim 23,
wherein the electrically conductive composite material forms at least part of the encapsulation.

25. A method of manufacturing an integrated circuit, the method comprising:
providing at least one semiconductor device; and
fixing an electrically conductive composite material comprising a metal to the at least one semiconductor device,
wherein the electrically conductive composite material has a CTE value smaller than a CTE value of the metal.

26. The method of claim 25,
wherein the fixing the electrically conductive composite material on the at least one semiconductor device comprises at least one of soldering, molding, plating, depositing, sintering and glueing.

27. The method of claim 25,
wherein the fixing the electrically conductive composite material on the at least one semiconductor device comprises either forming a common boundary layer between the electrically conductive composite material and the at least one semiconductor device or forming an adhesion layer between the electrically conductive composite material and the at least one semiconductor device adhering to the electrically conductive composite material and to the at least one semiconductor device.

28. The method of claim 25,
wherein the at least one semiconductor device comprises a plurality of semiconductor devices, further comprising:

singulating the at least one semiconductor device into individual semiconductor devices.

29. The method of claim 28, wherein the singulating comprises at least one of etching, die cutting, laser ablation, sawing and wire-electro discharge machining.

* * * * *